United States Patent

Nistler

Patent Number: 6,084,410
Date of Patent: Jul. 4, 2000

[54] TUNABLE RADIO-FREQUENCY UNIT FOR A MAGNETIC RESONANCE DEVICE

[75] Inventor: Juergen Nistler, Erlangen, Germany

[73] Assignee: Siemens Aktiengesellschaft, Munich, Germany

[21] Appl. No.: 09/098,425

[22] Filed: Jun. 17, 1998

[30] Foreign Application Priority Data

Mar. 11, 1998 [DE] Germany ............... 298 04 339 U

[51] Int. Cl.$^7$ ................................................. G01V 3/00
[52] U.S. Cl. ............................................. 324/318; 324/322
[58] Field of Search .................................. 324/318, 322, 324/311, 307, 316

[56] References Cited

U.S. PATENT DOCUMENTS

| | | | |
|---|---|---|---|
| 4,739,271 | 4/1988 | Haase | 324/322 |
| 4,801,885 | 1/1989 | Meissner et al. | 324/318 |
| 4,901,022 | 2/1990 | Keren et al. | 324/322 |
| 4,910,461 | 3/1990 | Van Vaals | 324/318 |

*Primary Examiner*—Christine Oda
*Assistant Examiner*—Brij B. Shrivastav
*Attorney, Agent, or Firm*—Hill & Simpson

[57] ABSTRACT

A tunable radio-frequency unit for a magnetic resonance device has a radio-frequency antenna and a radio-frequency signal line connected to a signal terminal of the radio-frequency antenna. The length of the radio-frequency signal line corresponds to a whole-number multiple of a half-wavelength of a radio-frequency signal on the radio-frequency signal line, for a given operating frequency of the radio-frequency antenna. For switching a short circuit on and off, a switching arrangement is connected at an end of the signal line lying opposite the signal terminal.

7 Claims, 2 Drawing Sheets

TUNABLE RADIO-FREQUENCY UNIT FOR A MAGNETIC RESONANCE DEVICE

BACKGROUND OF THE INVENTION

1. Field of the Invention

The present invention relates to a tunable radio-frequency unit for a magnetic resonance device with a radio-frequency antenna and a radio-frequency signal line connected thereto.

2. Description of the Prior Art

U.S. Pat. No. 4,801,885 teaches a tunable radio-frequency unit of the above-described type. The radio-frequency unit belongs to a diagnostic magnetic resonance device and is constructed for exciting and receiving magnetic resonance signals in a patient. The radio-frequency unit includes a radio-frequency antenna which is formed by two sub-systems. The two subsystems are connected to a common terminal point of a matched connection via respective radio-frequency signal lines. At the common terminal point, a $\lambda/4$ stub is additionally connected which can be operated selectively at its ends with a switch to represent a short circuit or a no-load condition. The designation $\lambda$ stands for the wavelength of a radio-frequency signal, given the operating frequency on the stub. The $\lambda/4$ stub transforms a short circuit at the end of the stub into a no-load at the common terminal point, as well as transforming a no-load at the end into a short circuit at the common terminal point. The short circuit effects a tuning of the connected radio-frequency antenna. This is necessary if another antenna is used for transmitting and receiving a magnetic resonance signal. A good decoupling of the two antennas is achieved by means of the tuning. It is a disadvantage, however, that the $\lambda/4$ transformation line requires additional structural volume.

Another possibility for realizing a tunable radio-frequency unit is to short-circuit resonance capacitors (shorting capacitors) belonging to the radio-frequency antenna so as to tune the antenna. To avoid disturbing interactions with the magnetic resonance device, pneumatically operated switches, for example, are utilized for this purpose. Such switches, however, require a pneumatic feed line to the magnetic resonance device. There are also tuning circuits using PIN diodes, however, they must be operated for this purpose with a very high bias voltage on the order of magnitude of 500 V. Besides, the tuning effect of the PIN diode circuit is limited, due to the short circuit, which is not ideal.

SUMMARY OF THE INVENTION

It is an object of the invention to provide a tunable radio-frequency unit for which costly circuits are not necessary and which effects a broadband tuning of the radio-frequency antenna.

The object is achieved, in a tunable radio-frequency unit wherein a switching arrangement for switching a short circuit on and off inside the signal line, is connected at a distance from the terminal of the radio-frequency antenna which corresponds to a whole-number multiple of a half-wavelength of a radio-frequency signal on the radio-frequency signal line, for a given operating frequency of the radio-frequency antenna. The short circuit is transformed directly to the terminal of the high-frequency antenna via the radio-frequency signal line which is $n \cdot \lambda/2$ in length (n=1, 2, 3 . . . ), so that a broadband tuning of the radio-frequency antenna is achieved.

In an embodiment the switching arrangement has at least one switch contact which can be mechanically actuated. The switch contact represents a nearly ideal short circuit for tuning.

In another embodiment, the switching arrangement has an electromagnetic drive. Because of the presence of the radio-frequency signal line which is $n \cdot \lambda/2$ in length, such an electromagnetic drive of the switching arrangement is located far enough away so as not to disturb the operation of the antenna.

In a further embodiment, the radio signal line is connected to a matching unit, and the matching unit forms a unitary structural component with the switching arrangement. Thus, the switching arrangement can be handled and also driven as a part of the matching unit.

DESCRIPTION OF THE PREFERRED EMBODIMENTS

Figure 1:
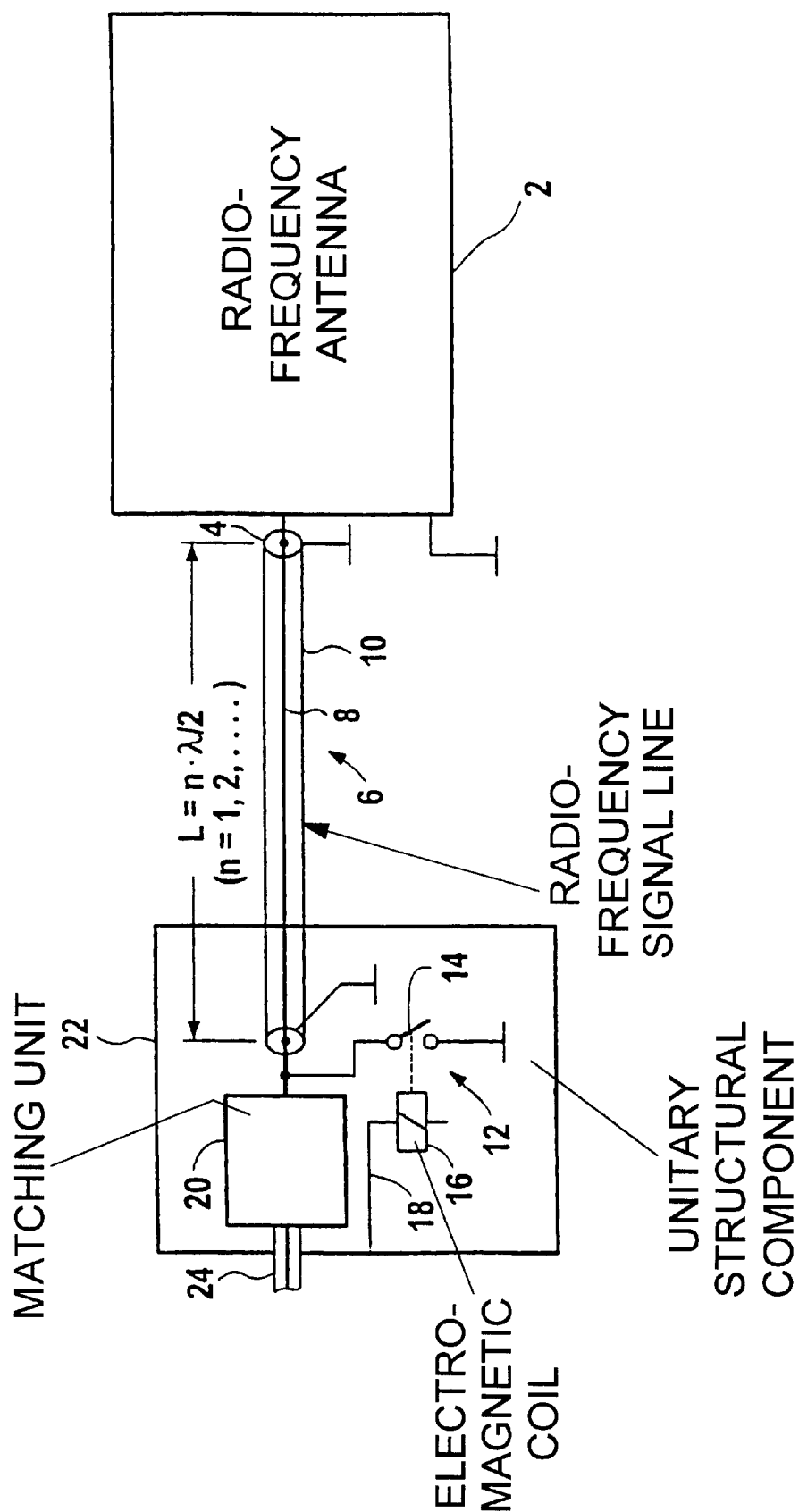
FIG. 1 schematically illustrates a tunable radio-frequency unit for a magnetic resonance device constructed in accordance with the invention.

FIG. 1 shows a tunable radio-frequency transmit-receive unit for a diagnostic magnetic resonance device. The radio-frequency transmit-receive unit includes a radio-frequency antenna 2, which, as a whole-body antenna, can accept a patient being examined in its interior. The radio-frequency antenna 2 has a signal terminal 4, to which a radio-frequency signal line 6 with an inner conductor 8 and an outer conductor 10 is connected in the form of a coaxial cable. The coaxial cable has a length L which corresponds to a whole-number multiple of the half-wavelength $\lambda$ of a radio-frequency signal on the radio-frequency signal line 6, for an operating frequency on the radio-frequency antenna 2. Given a typical 50 $\Omega$ coaxial line and an operating frequency of 42 MHZ, for example, the length L for $\lambda/2$ of the high frequency signal line 6 is approximately 3.1 m.

At the other end of the radio-frequency signal line 6—this end lying opposite the signal terminal 4—a switching arrangement 12 is connected for switching a short circuit on and off inside the signal line 6. The switching arrangement 12 has a switch contact 14 which can be mechanically actuated, and which is connected to the inner conductor 8 and the outer conductor 10. If the switch contact 14 is closed, then the radio-frequency signal line 6 transforms the short circuit at the input side to the signal terminal 4, whereby the radio-frequency antenna 2 is tuned in a broadband fashion. In the open condition of the switch contact 14, a signal flow can occur from and to radio-frequency antenna 2. If it is electrically necessary, the switch contact 14 can be realized by a number of electrical contacts connected in parallel.

The driving of the switch contact 14 occurs via an electromagnetic coil 16 which can be activated via an actuation line 18.

Figure 2:
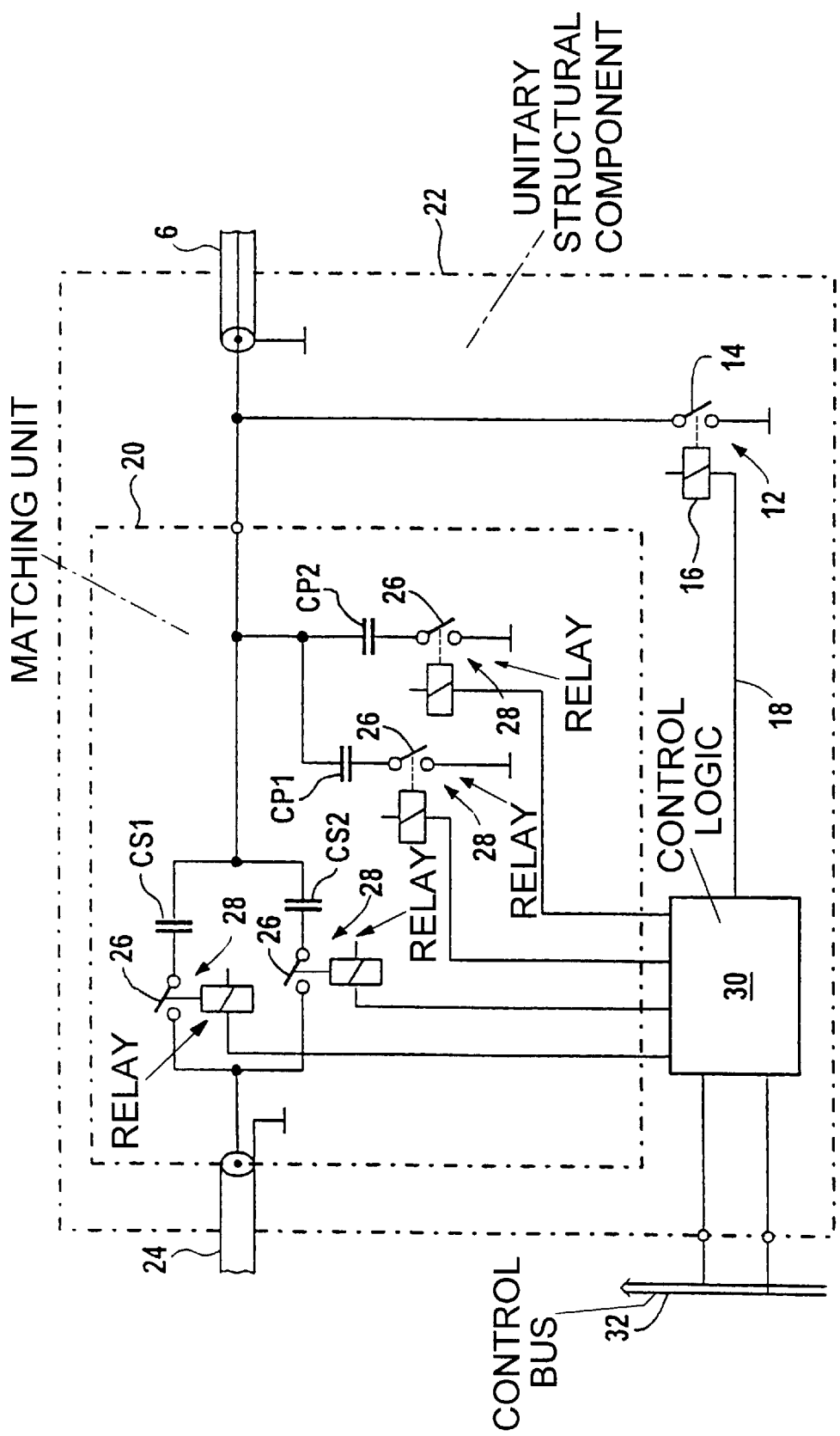
FIG. 2 shows a unitary a structural component incorporating a matching unit and a short circuit switching arrangement, constructed in accordance with the invention.

The switching arrangement 12 can form a structural unit 22 with a matching unit 20. The details shown in FIG. 2 are contained in a common housing. The matching unit 20 has driveable series capacitors CS1 and CS2 and parallel capacitors CP1 and CP2, in order to be able to transform the impedance of the antenna 2—including the radio-frequency signal line 6—onto a real resistance of 50 $\Omega$ on a connection line 24, for example. The connection line 24 connects the radio-frequency unit with a radio-frequency transmitter and/ or a radio-frequency receiver (not depicted in FIG. 2).

For controlling the series and parallel capacitors CS1, CS2 or CP1, CP2, switch contacts 26 belonging to switch relays 28 are electrically connected in series to these capacitors. The switch relays 26 are driven by output signals from control logic 30, just like the electromagnetic coil 16. At the input side, control logic 30 is connected to a control bus 32—e.g. a CAN bus—which transmits control signals produced by a central control unit (not shown).

Although various minor modifications might be suggested by those skilled in the art, it should be understood that my wish to embody within the scope of the patent warranted hereon all such modifications as reasonably and properly come with the scope of my contribution to the art.

I claim as my invention:

1. A tunable radio-frequency unit for a magnetic resonance device comprising:

a radio-frequency antenna operable at an operating frequency, having a signal terminal;

a radio-frequency signal line connected to said signal terminal of said radio-frequency antenna, said radio-frequency signal line having a length equal to a whole-number multiple of a half-wavelength of a radio-frequency signal on said radio frequency signal line when said radio-frequency antenna is at said operating frequency; and switching means, connected to an end of said signal line opposite said signal terminal, for producing a short circuit or an open circuit at said end of said signal line opposite said signal terminal, dependent on a state of said switching means.

2. A tunable radio-frequency unit as claimed in claim 1 wherein said switching means comprises at least one mechanically actuatable switch contact.

3. A tunable radio-frequency unit as claimed in claim 2 further comprising electromagnetic drive means for actuating said at least one switching contact.

4. A tunable radio-frequency unit as claimed in claim 1 wherein said signal line comprises a co-axial line.

5. A tunable radio-frequency unit as claimed in claim 4 wherein said co-axial line comprises an inner conductor and an outer conductor, and wherein said switching means is connected to said inner conductor and to said outer conductor.

6. A tunable radio-frequency unit as claimed in claim 1 further comprising a matching unit connected at said end of said signal line opposite said signal terminal, said matching unit and said switching means forming a single, unitary structural unit.

7. A tunable radio-frequency unit as claimed in claim 1 wherein said radio-frequency antenna comprises a whole-body antenna for examining a subject.

* * * * *